United States Patent
Byrd

(10) Patent No.: US 6,981,199 B2
(45) Date of Patent: Dec. 27, 2005

(54) METHOD FOR ARRANGING DATA OUTPUT BY SEMICONDUCTOR TESTERS TO PACKET-BASED DEVICES UNDER TEST

(75) Inventor: Phillip E. Byrd, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/459,336

(22) Filed: Jun. 11, 2003

(65) Prior Publication Data

US 2003/0200498 A1 Oct. 23, 2003

Related U.S. Application Data

(63) Continuation of application No. 09/921,767, filed on Aug. 3, 2001, now Pat. No. 6,760,871, which is a continuation of application No. 09/146,629, filed on Sep. 3, 1998, now Pat. No. 6,374,376.

(51) Int. Cl.[7] ............................................. H03M 13/00
(52) U.S. Cl. ......................... 714/776; 714/775; 714/718
(58) Field of Search ........................... 714/718, 12, 738, 714/775–776; 365/201, 189.01; 709/233, 237, 238, 248; 710/5, 9, 307

(56) References Cited

U.S. PATENT DOCUMENTS

| | | |
|---|---|---|
| 4,363,094 A | 12/1982 | Kaul et al. |
| 5,341,341 A | 8/1994 | Fukuzo |
| 5,442,642 A | 8/1995 | Ingalls et al. |
| 5,453,995 A | 9/1995 | Behrens |
| 5,499,248 A | 3/1996 | Behrens et al. |
| 5,553,025 A | 9/1996 | Haraguchi |
| 5,555,208 A | 9/1996 | Nishihara |
| 5,606,717 A | 2/1997 | Farmwald et al. |
| 5,644,708 A | 7/1997 | Larsson |
| 5,684,750 A | 11/1997 | Kondoh et al. |
| 5,687,312 A | 11/1997 | Whetsel |
| 5,708,614 A | 1/1998 | Koshikawa |
| 5,751,656 A | 5/1998 | Schaefer |
| 5,752,076 A | 5/1998 | Munson |
| 5,754,789 A | 5/1998 | Nowatzyk et al. |
| 5,758,063 A | 5/1998 | Lindsay et al. |
| 5,781,477 A | 7/1998 | Rinerson et al. |
| 5,784,382 A | 7/1998 | Byers et al. |
| 5,796,740 A * | 8/1998 | Perlman et al. .............. 370/401 |
| 5,826,068 A | 10/1998 | Gates |
| 5,838,694 A | 11/1998 | Illes et al. |
| 5,956,349 A | 9/1999 | Watanabe et al. |
| 6,014,759 A | 1/2000 | Manning |
| 6,085,346 A | 7/2000 | Lepejian et al. |
| 6,181,616 B1 | 1/2001 | Byrd |
| 6,195,772 B1 * | 2/2001 | Mielke et al. .............. 714/724 |
| 6,374,376 B1 | 4/2002 | Byrd |

FOREIGN PATENT DOCUMENTS

EP     0 329 798     8/1989

OTHER PUBLICATIONS

Chauchin Su et al. Decentralized BIST for 1149.1 and 1149.5 Based Interconnects; IEEE; 1996.*
Jer Min Jou and Shung–Chih Chen, "A New Fault Simulator for Large Synchronous Sequential Circuits," Circuits and Systems 1994, APCCAS '94, 1994 IEEE Asia–Pacific Conference, pp. 466–471, 1994.
Draft Standard for A High–Speed Memory Interface (SyncLink). Microprocessor and Microcomputer Standard Subcommittee of the IEEE Computer Society, 1996.
400 Mb/s/pin SLDRAM 4M×18 SLDRAM Draft Advance. SLDRAM, Inc., 1998.

* cited by examiner

Primary Examiner—Guy J. Lamarre
(74) Attorney, Agent, or Firm—TraskBritt

(57) ABSTRACT

Method for testing packet-based semiconductor devices by using simplified test data packets. Simplified test data packets are generated by conventional memory testers in one format. The simplified test data packets are realigned to another, different format by test mode circuitry located on an integrated circuit chip, test interface, or tester prior to testing the memory device. The test method potentially reduces the number of pieces of data which must be generated using an algorithmic pattern generator on a per-pin basis. Furthermore, the test method potentially reduces the number of packet words that has a combination of data generated from an APG and vector memory. Packet-based semiconductor devices are also disclosed.

8 Claims, 9 Drawing Sheets

| | Flag | CA9 | CA8 | CA7 | CA6 | CA5 | CA4 | CA3 | CA2 | CA1 | CA0 |
|---|---|---|---|---|---|---|---|---|---|---|---|
| WORD 0 | 0 vm | x | x | x | x | x | x | x | x | x | x |
| WORD 1 | 1 vm | ID8 vm | ID7 vm | ID6 vm | ID5 vm | ID4 vm | ID3 vm | ID2 vm | ID1 vm | ID0 vm | CMD5 vm |
| WORD 2 | 0 vm | CMD4 vm | CMD3 vm | CMD2 vm | CMD1 vm | CMD0 vm | BNK2 apg | BNK1 apg | BNK0 apg | ROW9 apg | ROW8 apg |
| WORD 3 | 0 vm | ROW7 apg | ROW6 apg | ROW5 apg | ROW4 apg | ROW3 apg | ROW2 apg | ROW1 apg | ROW0 apg | 0 vm | 0 vm |
| | 0 vm | 0 vm | 0 vm | 0 vm | COL6 apg | COL5 apg | COL4 apg | COL3 apg | COL2 apg | COL1 apg | COL0 apg |

FIG. 1 (Prior Art)

| | Flag | CA9 | CA8 | CA7 | CA6 | CA5 | CA4 | CA3 | CA2 | CA1 | CA0 |
|---|---|---|---|---|---|---|---|---|---|---|---|
| WORD 0 | 0 vm | x | x | x | x | x | x | x | x | x | x |
| WORD 1 | 1 vm | ID8 vm | ID7 vm | ID6 vm | ID5 vm | ID4 vm | ID3 vm | ID2 vm | ID1 vm | ID0 vm | 0 vm |
| WORD 2 | 0 vm | CMD4 vm | CMD3 vm | CMD2 vm | CMD1 vm | CMD0 vm | 0 vm | 0 vm | 0 vm | 0 vm | CMD5 vm |
| WORD 3 | 0 vm | ROW7 apg | ROW6 apg | ROW5 apg | ROW4 apg | ROW3 apg | ROW2 apg | ROW1 apg | ROW0 apg | ROW9 apg | ROW8 apg |
| WORD 4 | 0 vm | BNK2 apg | BNK1 apg | BNK0 apg | COL6 apg | COL5 apg | COL4 apg | COL3 apg | COL2 apg | COL1 apg | COL0 apg |

FIG. 2

METHOD FOR ARRANGING DATA OUTPUT BY SEMICONDUCTOR TESTERS TO PACKET-BASED DEVICES UNDER TEST

CROSS-REFERENCE TO RELATED APPLICATIONS

This application is a continuation of application Ser. No. 09/921,767, filed Aug. 3, 2001, now U.S. Pat. No. 6,760,871, issued Jul. 6, 2004, which is a continuation of application Ser. No. 09/146,629, filed Sep. 3, 1998, now U.S. Pat. No. 6,374,376, issued Apr. 16, 2002.

BACKGROUND OF THE INVENTION

Field of the Invention: The present invention relates to testing of integrated circuit devices and, in particular, to testing packet-based semiconductor memories and the devices themselves.

As the complexity of semiconductor integrated circuits continues to increase, difficulties begin to arise in the use of generalized test equipment to ensure the desired operability of each device. The increasing complexity of these devices is driven largely by the need to increase speed and bandwidth and, as such, the architecture of these devices changes to achieve this result. These changes in device architecture, in many cases, make the utilization of existing test equipment difficult, if not impossible. Purchasing new test equipment is often economically undesirable, particularly if only a segment of a production line utilizes these device architectures.

The generalized test equipment used to test semiconductor integrated circuits may vary between manufacturer and intended use, but in general, the test equipment is used to monitor processes, test board and box level assemblies, and may be used to test the functionality of an integrated circuit.

One type of test equipment that is of particular interest in the case of manufacturing memory devices is referred to as a "memory tester." Hereinafter, the terms "memory tester" and "tester" will be used interchangeably. Memory testers allow for the functional testing of integrated memory circuits to identify defects at the time of test. Identification of a defective device gives the manufacturer the options of reworking, repairing, or possibly scrapping the device. Because of the cost added at each step of the manufacturing process, the earlier a defect can be discovered, the more cost efficient the manufacturing process will be.

Functionally testing integrated memory circuits typically involves the development of a logical model of the device to be tested. The model defines input pins for the application of stimuli to the device under test (DUT) and output pins for observation of the response from the DUT. Logical models are typically developed with the requirements of the intended tester in mind. With an accurate model, a measured response from a DUT can be compared against the anticipated model response, and if it does not match, then a faulty device has been detected.

In a typical tester, an algorithmic pattern generator (APG) is provided as a resource for stimuli of the input pins of a DUT. The APG typically provides a first X address generator and a second Y address generator. To illustrate the operation of an APG, imagine writing zeros into every address of a DUT. In this case, the data generator would generate a continuous "0." The X address generator would run from "0" to a predefined end address, whereas the Y address generator would maintain its initial value. Once the X address generator reaches its end address, it would be reset to "0," the Y address generator would be increased by one, and the X address generator would again run from "0" to its end address. This process would continue until all cells of the memory under test contained a "0."

The controller of such an APG typically includes a programmable vector memory for storing test patterns. Vector memory is typically limited in size. If a sufficiently large number of test patterns are necessary to test a given device, it may require loading more than one set of test patterns in vector memory to complete the test. Thus, it is advantageous to use an APG where possible to preserve available vector memory and allow for more efficient operation.

A packet-based semiconductor memory operates on more than one word of information in a given cycle. The packet information could be data, address, command or any other type of data which the device is capable of receiving or outputting. The number of words in a given packet cycle is determined by the particular device architecture. The term "data packets" and "packets" are used interchangeably herein to include data, address and command information.

Because many tester APGs have only X and Y address generators, it is difficult to generate more than two bits of APG data as input stimuli to a DUT. The same problem would arise for an APG with N address generators if one was attempting to generate more than N bits of APG data. Herein lies the problem with testing integrated memory circuits which require packet-based information. With packet-based devices, there may be a need for more than two bits of APG data per input pin as stimuli. This may require the use of vector memory to supply the additional information bits.

To illustrate the problem, consider, for example, the draft specification for a 4 Megabit×18 I/O Synchronous-Link Dynamic Random Access Memory (SLDRAM). The draft specification for this packet-based semiconductor memory is titled *Draft/Advance, SLDRAM Inc., SLD4M18DR400, 4 MEG×18 SLDRAM*, Rev. Feb. 12, 1998. FIG. 1 is a table reproducing the information in a Read, Write or Row Operation Request Packet, as defined in the above-referenced draft specification, page 7, which comprises four 10-bit words, WORD 0, WORD 1, WORD 2, and WORD 3. As depicted, the first row of data under the column heading represents prior data in a packet stream, which are not of concern, hence the "don't care" or "x" value placed within each bit location. Each column of data represents an input pin on the SLDRAM device, including the Flag bit. The Command Address bits, CA0–CA9, define the 10-bit command words. The beginning of a packet is indicated by the Flag bit being in a logical true. The Flag bit logical true also indicates that the first word in a packet, WORD 0, is present on the CA0–CA9 bits.

The data within each of the four command words, WORD 0–3, are latched with timing signals not shown in FIG. 1. WORD 0 contains the nine identification bits, ID0–ID8, used to identify a particular SLDRAM in an array of such memory devices, as well as CMD5, which is one of six command code bits. WORD 1 contains CMD0–4, BNK0–2, and ROW8–9. The command bits CMD0–5 are used to instruct the SLDRAM to perform a particular memory operation. For example, where all six of the CMD0–5 bits are zero, the command is: Page Access, Burst of 4, Read Access, Leave Row Open, Drive DCLK0. The bank address bits BNK0–2 are used to select one of eight memory banks, where each memory bank is 1024 rows×128 columns×72 bits in size. WORD 2 contains eight of the row address bits, ROW0–7, and two unused bits. WORD 3 contains seven column address bits, COL0–6, and three unused bits.

The address bits, bank, row and column are particularly suitable for algorithmic pattern generation because it is frequently the case that one wants to sequence through the addresses when performing a read or write operation. In contrast, the command code bits CMD0–5 are accessed in a more or less random order, so vector memory is more appropriate and convenient as a source of test patterns. In FIG. 1, this test pattern source preference has been indicated by the abbreviations "vm" for vector memory and "apg" for algorithmic pattern generator.

Ideally, the bank, row and column addresses would each be assigned one of the address generators in the APG. However, as noted above, conventional APGs typically have only two address generators, X and Y. To illustrate the problem, refer to FIG. 1, column CA3, which represents command address pin 3. For pin CA3, the tester must provide three pieces of algorithmic data, BNK1, ROW1, and COL3, in addition to ID2, which is sourced from vector memory. Furthermore, WORDs 1–3 contain combinations of data from vector memory and an APG.

In most cases, it is possible to create a description of a combination of required vectors and APG bits to accommodate each of the cycles described in a typical packet. This approach, however, requires much additional work to format pins appropriately and may consume additional tester resources.

The cost of testing is a significant portion of integrated circuit manufacturing costs. Digital integrated circuit testers (specifically memory testers) can be costly and require significant calibration and maintenance expenses over time. The useful life of such a tester is limited by its design—the number of pins, pattern depth, and signal generating and comparison speeds. These and other factors limit the number of applications the tester can be used for, due to changes in integrated circuit architecture, increasing signal speeds, increasing disparity of signal speeds, and the increasing number of functions designed into a single integrated circuit package. While it is always an option to purchase state-of-the-art test equipment to accommodate a new generation of IC, the cost is prohibitive unless absolutely necessary.

Because of the increased costs associated with designing test programs to test packet-oriented memory devices and the limited resources of conventional memory testers, there is a need in the art for devices or methods to test packet-based semiconductor memory devices by rearranging the signals within words of a predefined packet to allow simplified and lower cost testing with conventional tester architecture.

BRIEF SUMMARY OF THE INVENTION

To overcome the problem of testing semiconductors with packet-based architectures using conventional memory test equipment, the apparatus and system of the present invention utilizes data realignment circuitry. To avoid confusion, the following terminology will be used throughout this application. The DUT is designed to accept packets in a first or "realigned" format. A conventional tester may be employed to generate test data packets in a second format different from the first. This second format is also referred to as "facilitated" test data. The data realignment circuitry of the present invention realigns test data packets from the second, facilitated format into test data packets in the first format, which the DUT can recognize. The invention reduces the number of required tester resources on a per-pin basis. In other words, the inventive test mode circuitry reformats easily generated or simplified (i.e., facilitated) test data to conform with a given packet definition or specification that would otherwise be difficult to generate directly with conventional test equipment. The invention also provides methods of generating simplified test data from conventional memory test equipment and methods of realigning the simplified test data to the proper packet data specification.

FIG. 2 represents the same packet information as in a conventional Read, Write, or Row Operation Request packet definition for a 4M×18 SLDRAM (four, 10-bit command address words, plus a Flag bit), but in a format that is easier to produce with conventional memory testers in accordance with the invention. Note that there is a one-to-one correspondence between the information in FIG. 1 and FIG. 2. More specifically, WORD 0 contains identification bits, ID0–8. It should be noted that it is a simple task to generate the desired identification bit data from vector memory (if required) in a single word or tick of a packet. WORD 1 contains command bits, CMD0–5, which can also be sourced easily from vector memory. WORD 2 contains the row address bits, ROW0–9, which are ideally generated using a single address generator from an APG. And finally, WORD 3 contains bank address bits, BNK0–2, and column address bits, COL0–6, which are ideally generated by one or two address generators in an APG. Note more importantly, that none of the command address bits, CA0–9, contain more than two pieces of algorithmic data.

This facilitated SLDRAM packet data is then converted back to the original SLDRAM-recognizable packet format with the inventive test mode data realignment circuitry for use by the remaining conventional SLDRAM circuitry per its specification. The inventive test mode realignment circuitry can be implemented in any one of a number of preferred embodiments.

A first embodiment of the present invention incorporates a discrete block of data realignment circuitry on an SLDRAM located between the command and address and Flag pins and the command and address capture or latching circuitry.

A second embodiment of the present invention integrates the data realignment function with the command and address latching function. Still further embodiments move the data realignment function off-chip to, respectively, a test interface and a memory tester. Computer systems may be fabricated using memory chips incorporating the inventive data realignment testing scheme. These embodiments and attendant advantages of the invention will be readily understood by reading the following detailed description in conjunction with the accompanying figures of the drawings.

BRIEF DESCRIPTION OF THE SEVERAL VIEWS OF THE DRAWINGS

FIG. 1 is a table illustrating a data specification of a conventional SLDRAM Read, Write, or Row Operation Request command packet;

FIG. 2 is a table illustrating a reordering of the data contained in the table of FIG. 1 to facilitate simple generation with conventional memory test equipment in accordance with this invention;

DETAILED DESCRIPTION OF THE INVENTION

The following detailed description will refer to a memory device under test (DUT) embodied as a Synchronous-Link Dynamic Random Access Memory (SLDRAM) device, but it should be noted that the invention is not limited to SLDRAM architecture. It should be obvious to those of ordinary skill in the art that the inventive methods, apparatuses and systems could be used with other packet-oriented semiconductor memory architectures such as Rambus technology, i.e., Rambus Dynamic Random Access Memory (RDRAM), an example of which is provided in U.S. Pat. No. 5,606,717 to Farmwald et al., incorporated herein by reference; FLASH memory technology, an example of which is provided in U.S. Pat. No. 5,781,477 to Rinerson et al., incorporated herein by reference; Synchronous Dynamic Random Access Memory (SDRAM), an example of which is provided in U.S. Pat. No. 5,751,656 to Schaefer, incorporated herein by reference; Dynamic Random Access Memory (DRAM), an example of which is provided in U.S. Pat. No. 5,341,341 to Fukuzo, incorporated herein by reference; Static Random Access Memory (SRAM), an example of which is provided in U.S. Pat. No. 5,555,208 to Nishihara, incorporated herein by reference; Synchronous Static Random Access Memory (SSRAM), an example of which is provided in U.S. Pat. No. 5,684,750 to Kondoh et al., incorporated herein by reference; and a memory controller, an example of which is provided in U.S. Pat. No. 5,644,708 to Larrson, incorporated herein by reference; and any other packet-based semiconductor memory architecture where test data is difficult to generate with conventional memory testers because of the packet-based nature of the particular device architecture.

Additionally, it should be obvious to those of ordinary skill in the art that the inventive methods, apparatuses and systems are not limited to memory devices and could be used in other packet-based devices such as: a data router, an example of which is provided in U.S. Pat. No. 5,796,740 to Perlman et al., incorporated herein by reference; a controller, an example of which is provided in U.S. Pat. No. 5,752,076 to Munson, incorporated herein by reference; a network controller, an example of which is provided in U.S. Pat. No. 5,754,789 to Nowatzyk et al., incorporated herein by reference; a microprocessor, microcontroller, or any other kind of packet-based semiconductor device. It should be noted that the command, data and address bandwidth, true logic state (whether high or low), flags, etc., of the particular embodiments described below are exemplary only and not intended to limit the scope of this invention.

By way of example, refer to the table in FIG. 1, which depicts the specification for a Read, Write, or Row Operation Request packet for a 4M×18 SLDRAM. For clarity, the following terminology will be used throughout: FIG. 1 is an example of data in the "realigned" format, whereas FIG. 2 shows the same information in a "facilitated" format.

Figure 3:
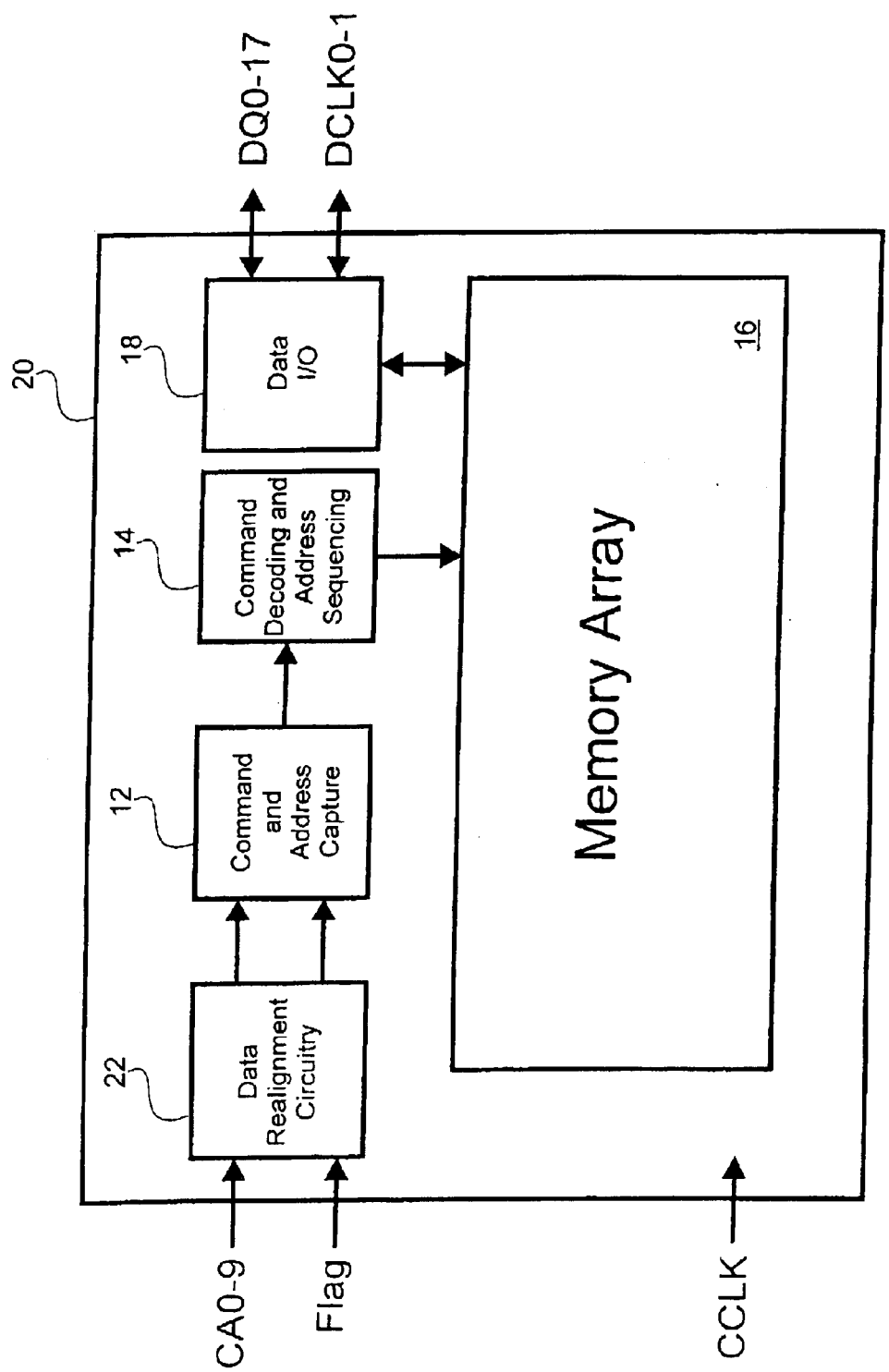
FIG. 3 is a block diagram of a first embodiment of a semiconductor memory in accordance with this invention that accepts data formatted as in FIG. 2 and realigns the data to the format of FIG. 1 in accordance with this invention.

Referring to FIG. 3, a first embodiment of the invention in a packet-based semiconductor memory 20 comprising a command and address capture block 12, command decoding and address sequencing block 14, memory array 16, and data I/O 18 is provided. The memory array 16 could be of any suitable size, e.g., 4M×18. The command and address capture block 12 latches the identification, command code, bank, row, and column address data. The data realignment circuitry block 22 is configured to take the facilitated data packet of FIG. 2 and realign the data to the format of FIG. 1 for use by the conventional SLDRAM circuitry. The physical implementation of the data realignment circuitry can be performed in any suitable combination of transistor, gate or higher level integrated circuitry by a person skilled in the art, and thus, will not be discussed in any further detail.

The data realignment circuitry can be configured to pass through data already in the format of FIG. 1. However, when the data realignment function is desired, it may be accessed by a special test mode. There are a number of ways in which a test mode might be accessed. For example, a special command code could be used, or a super-voltage applied to a particular command and address line. The physical implementation of the special test mode can be performed in any suitable manner by a person skilled in the art, and thus, will not be discussed in any further detail.

Figure 4:
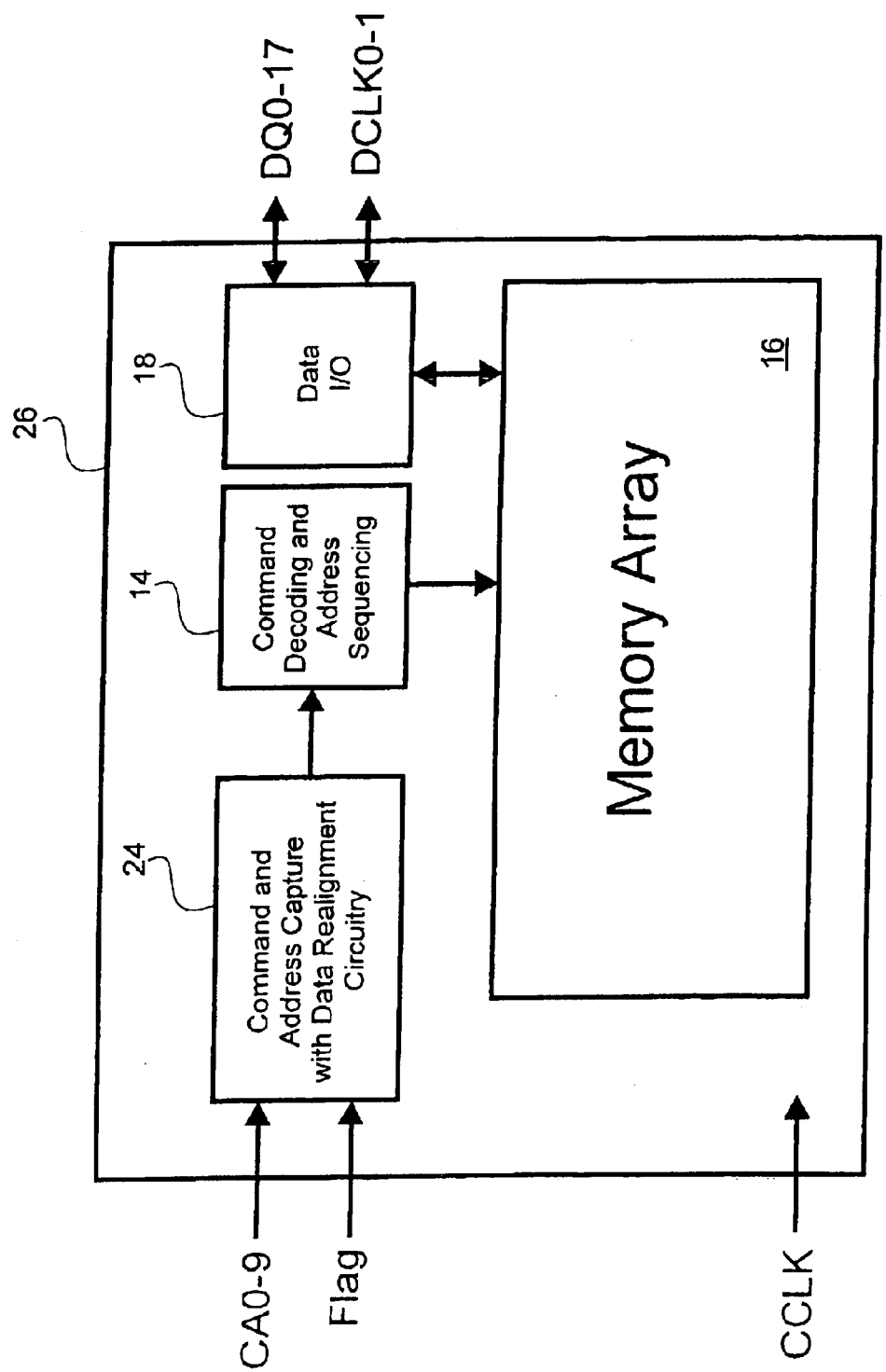
FIG. 4 is a block diagram of a second embodiment of a semiconductor memory in accordance with this invention that accepts data formatted as in FIG. 2 and realigns the data to the format of FIG. 1 in accordance with this invention.

FIG. 4 shows a second embodiment of the invention in a packet-based semiconductor memory 26. In this second embodiment, the command and address capture with data realignment circuitry block 24 integrates the command and address capture function 12 with the data realignment circuitry 22 of FIG. 3. The remaining blocks, command decoding and address sequencing 14, memory array 16, and data I/O 18 are substantially the same as described in FIG. 3. This embodiment is advantageous because there is the potential for integration efficiencies in combining the packet latching function with the inventive data realignment.

Figure 5:
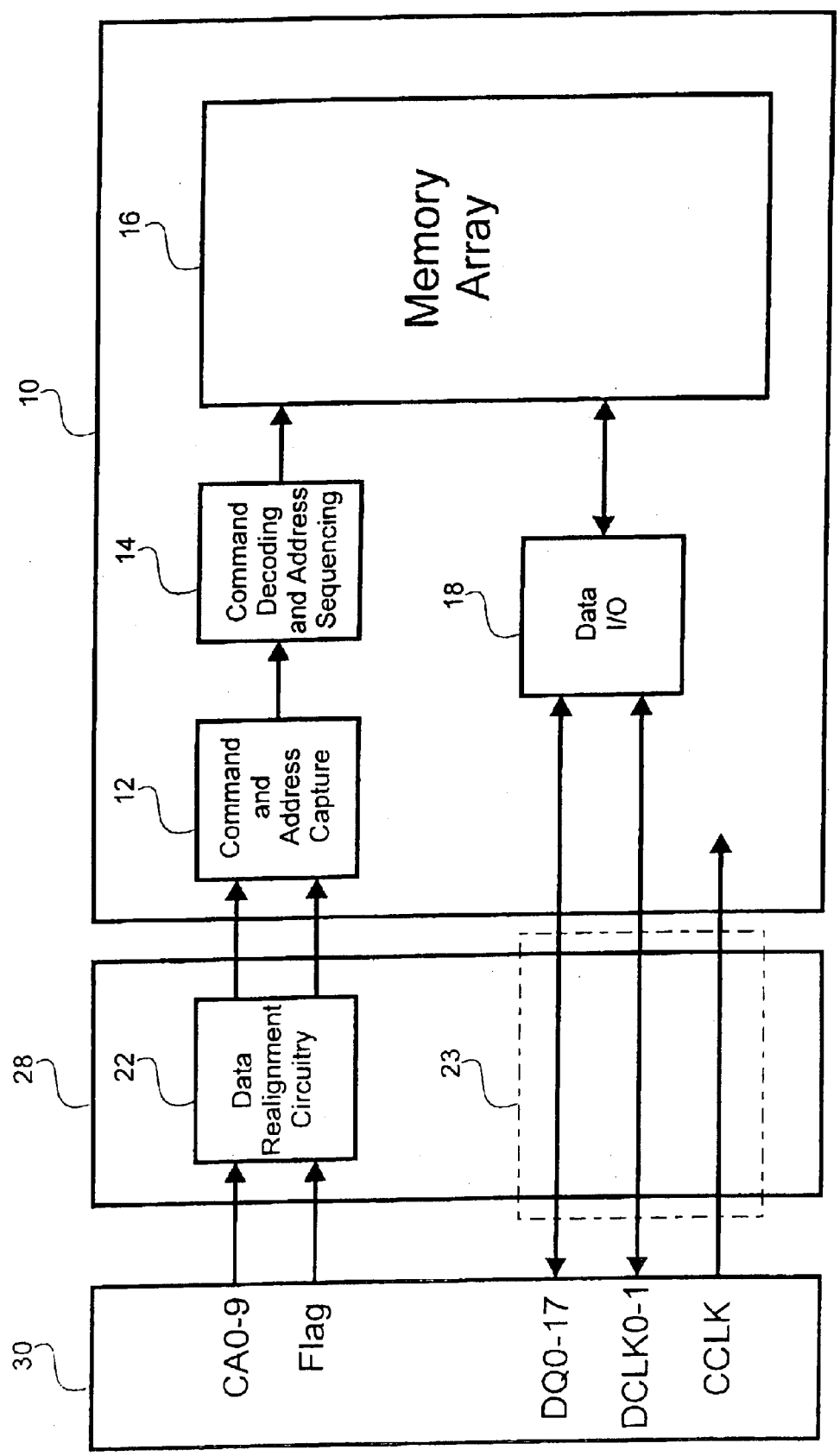
FIG. 5 is a block diagram of a test interface in accordance with this invention.

FIG. 5 is an alternative embodiment of the invention where the data realignment circuitry 22 has been placed on a test interface 28 between the memory tester 30, which provides the test data patterns, and the memory DUT 10. The test interface 28 may have pass-through connections 23 for data and clock I/O and other signals. For example, there may be 18 data I/O lines, 2 data clock I/O lines and a system clock line which are simply passed through the test interface 28.

Figure 6:
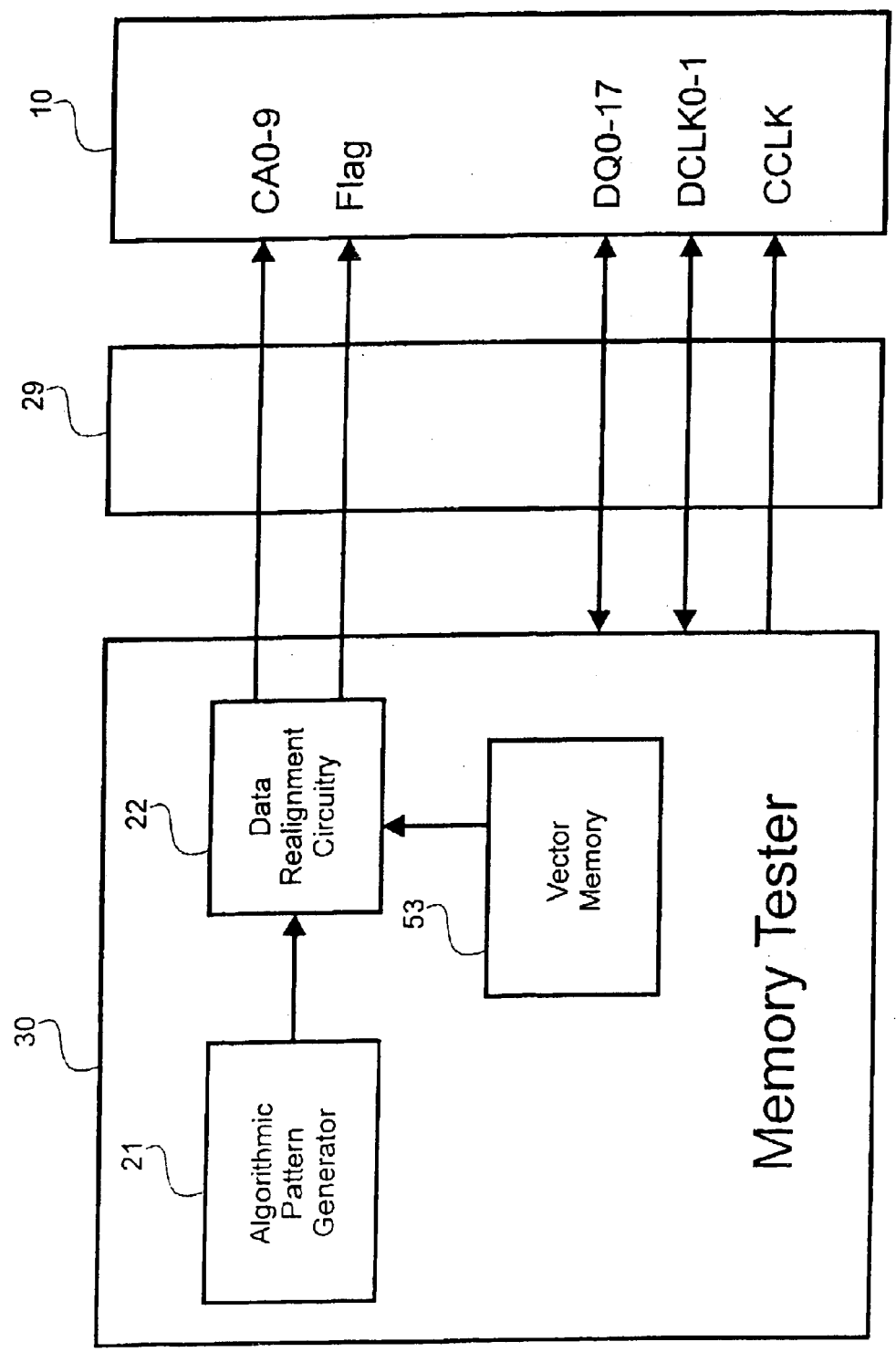
FIG. 6 is a block diagram of a memory tester in accordance with this invention.

FIG. 6 illustrates yet another embodiment of the invention where the data realignment circuitry 22 is placed on the memory tester 30 itself. A test interface 29 is shown between the memory tester 30 and the DUT 10 where such interface is needed. In this embodiment, test patterns are sourced in a facilitated format from an algorithmic pattern generator (APG) 21, or a vector memory 53, or both, prior to data realignment 22. Control of the APG 21, vector memory 53, and the data realignment circuitry 22 is performed by a controller not shown.

Figure 7:
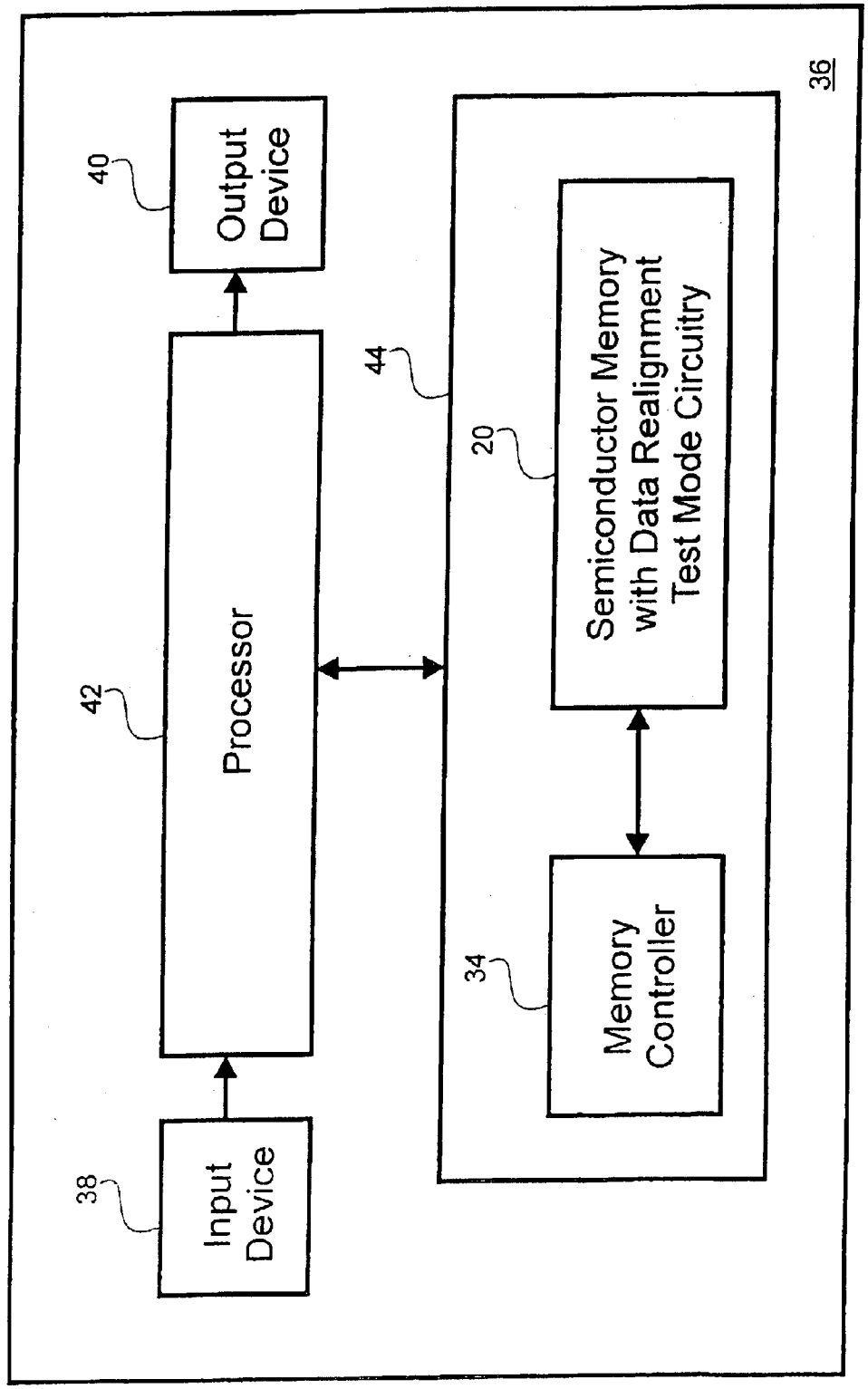
FIG. 7 is a block diagram illustrating an electronic system that includes a semiconductor memory incorporating a memory controller and semiconductor memory that includes the data realignment circuitry in accordance with this invention.

Referring to FIG. 7, an electronic system 36 includes an input device 38, an output device 40, a processor device 42, and a memory device 44 that includes a memory controller 34 interacting with a semiconductor memory 20 as illustrated in FIG. 3. The semiconductor memory 20 could, of course, be replaced with the semiconductor memory 26 of FIG. 4. Moreover, it will be understood that the data realignment circuitry may be incorporated into any packet-based semiconductor memory, including those constructed on such memory architectures as SLDRAM, RDRAM, FLASH, SDRAM, DRAM, SRAM, SSRAM, and ROM devices where applicable.

Figure 8:
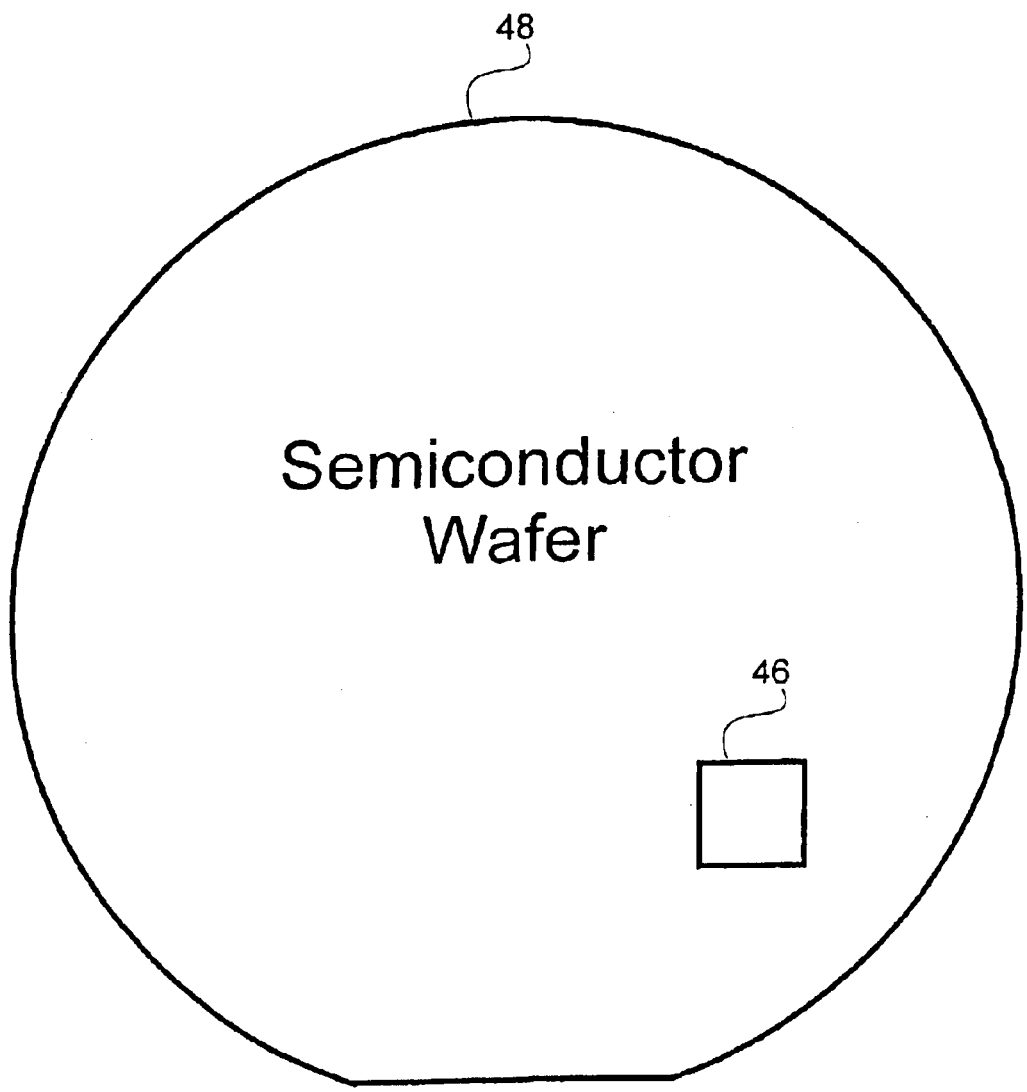
FIG. 8 is a diagram illustrating a semiconductor wafer on which the inventive test mode data realignment circuitry is fabricated in accordance with this invention.

In FIG. 8, a memory chip die 46 is provided on a semiconductor wafer 48. It should be understood that the memory chip die 46 on the wafer 48 could incorporate either the semiconductor memory 20 embodiment or the semiconductor memory 26 embodiment of FIGS. 3 and 4, respectively. The semiconductor technology employed is not a limiting factor in the application of the inventive data realignment circuitry 22. While silicon is the preferred bulk semiconductor material for commercial electronic devices, gallium arsenide and indium phosphide substrates may also be employed. Of course, it will be understood that the inventive data realignment circuitry 22 may be fabricated on other semiconductor substrates as well, including, for example, silicon-on-glass (SOG) substrates, silicon-on-insulator (SOI) substrates, and silicon-on-sapphire (SOS) substrates.

Figure 9:
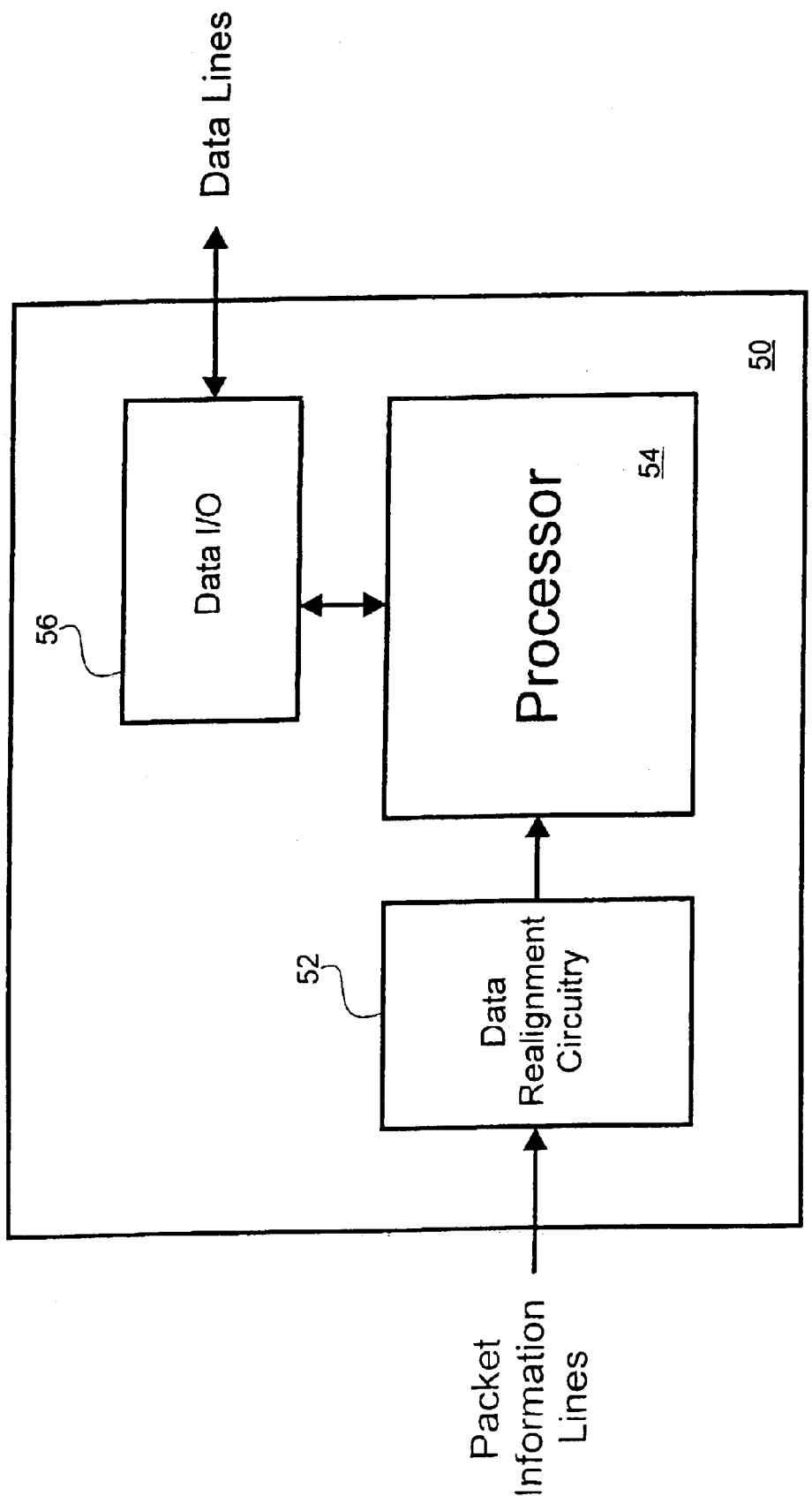
FIG. 9 is a block diagram of a packet-based semiconductor device in accordance with this invention.

Referring now to FIG. 9, yet another embodiment of the invention is shown schematically as a packet-based semiconductor device 50. In this embodiment, the packet-based semiconductor device 50 includes data realignment circuitry 52 coupled to a processor 54, which is in turn coupled to data I/O circuitry 56. A plurality of packet data lines are input to the data realignment circuitry 52. The data realignment circuitry converts packet information from a first format to a second facilitated format, different from the first format. The converted packet information is then used by the processor 54 to perform one or more operations based on the converted packet information. The data I/O circuitry 56 connects the packet-based semiconductor device 50 to external circuitry (not shown) to perform one or more predefined tasks as necessary according to processor operations.

A method of aligning test data packets according to this invention for packet-based memory devices may be described as follows. First, identify blocks of data, if any, within a given first packet format that can be generated using an algorithmic pattern generator. Second, identify remaining blocks of data, if any, within the first packet format which must be generated from vector memory. Finally, rearrange the identified blocks of algorithmically generatable data by moving the data into as few adjacent packet words as possible, forming a test data packet in a second, facilitated format different from the first, DUT-recognizable format. This transformation of data bits from the first format to the second format is performed by exchanging data bits, thus preserving a one-to-one correspondence between each data bit of the first and second formats. The method of realigning test data packets according to this invention is precisely the reverse of the method of rearranging just described, i.e., the test data packet in a second format is realigned to a test data packet in a first format.

Although this invention has been described with reference to particular embodiments, the invention is not limited to these described embodiments. Rather, it should be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. A method of realigning test data packets, comprising:

receiving first test data packets on a single integrated circuit chip, each of said first test data packets including a number n of data bits ordered serially in a first format; and serially reordering on said single integrated circuit chip said number n of said data bits of each of said first test data packets from said first format into second test data packets, each of said second test data packets including said number n of data bits ordered serially in a second format.

2. The method of claim 1 wherein receiving first test data packets comprises receiving said first test data packets each including a number m of words, each word including a number x of data bits and said second test data packets each including said number m of words, each word including a number x of data bits.

3. The method of claim 2 wherein each of said m words in said first format may be generated exclusively by either a vector memory or an algorithmic pattern generator.

4. A method of testing synchronous memory devices, the method comprising:

creating test data packets in a first format;

realigning said test data packets into a second format including:

receiving said first test data packets on a single integrated circuit chip, each of said first test data packets including a number n of data bits ordered serially in a first format; and serially reordering on said single integrated circuit chip said number n of said data bits of each of said first test data packets from said first format into second test data packets, each of said second test data packets including said number n of data bits ordered serially in a second format;

applying said second test data packets to a memory device under test (DUT);

receiving a response to said second test data packets from said memory DUT; and comparing said response by said memory DUT.

5. The method of claim 4 wherein receiving first test data packets comprises receiving said first test data packets each including a number m of words, each word including a number x of data bits and said second test data packets each including said number m of words, each word including a number x of data bits.

6. The method of claim 5 wherein each of said m words in said first format may be generated exclusively by either a vector memory or an algorithmic pattern generator.

7. The method of claim 4, further comprising providing a memory tester for creating said first test data packets in said first format.

8. The method of claim 4, further comprising providing a test interface adapter for realigning said first test data packets from said first format into said second test data packets of said second format.

* * * * *